United States Patent [19]

Nishimura

[11] Patent Number: 5,072,270
[45] Date of Patent: Dec. 10, 1991

[54] STACKED CAPACITOR TYPE DYNAMIC RANDOM ACCESS MEMORY

[75] Inventor: Yasumasa Nishimura, Hyogo, Japan

[73] Assignee: Mitsubishi Denki Kabushiki Kaisha, Tokyo, Japan

[21] Appl. No.: 605,324

[22] Filed: Oct. 30, 1990

[30] Foreign Application Priority Data

Nov. 8, 1989 [JP] Japan .................................. 1-291602

[51] Int. Cl.$^5$ ...................... H01L 29/68; H01L 27/02
[52] U.S. Cl. .................................... 357/23.6; 357/51; 357/41
[58] Field of Search ................... 357/23.6, 51, 41

[56] References Cited

U.S. PATENT DOCUMENTS 4,974,040  11/1990  Taguchi et al. .................... 357/23.6

FOREIGN PATENT DOCUMENTS 59-231851  12/1984  Japan .................................. 357/23.6
63-94669    4/1988  Japan .................................. 357/23.6
63-104466   5/1988  Japan .................................. 357/23.6
1-257365   10/1989  Japan .................................. 357/23.6

OTHER PUBLICATIONS

W. Wakamiya et al, "Novel Stacked Capacitor Cell for 64Mb Dram", 1989 Symposium on VLSI Technology Digest of Technical Papers, pp. 69–70.

Primary Examiner—William Mintel
Assistant Examiner—Robert P. Limanek
Attorney, Agent, or Firm—Lowe, Price, Leblanc & Becker

[57] ABSTRACT

A DRAM has a stacked capacitor. The stacked capacitor is formed of a first portion extending on an insulating layer on the substrate, a cylindrical second portion extending vertically upward from the first portion, and a third portion extending from the second portion to have an eaves-like shape, so as to increase charge storage capacity. The structure increases opposing areas between the electrodes of the capacitor, increasing the capacitor capacity. Between the adjacent capacitors, the projecting eaves-like third portions are overlapped with each other without contact, so as to increase the area of the third portions. By this structure, the marginal space between memory cells can be utilized as capacitor region.

21 Claims, 6 Drawing Sheets

STACKED CAPACITOR TYPE DYNAMIC RANDOM ACCESS MEMORY

BACKGROUND ART

1. Field of the Invention

The present invention relates to a DRAM having a stacked type capacitor and, more specifically, to an improvement of a structure of a capacitor which increases signal charge storing capacity.

2. Description of the Background Art

A dynamic random access memory (DRAM) is a semiconductor memory device capable of random input/output of memory information. Generally, the DRAM comprises a memory cell array which is a memory region for storing information and peripheral circuits necessary for the exchange of information with the outside. FIG. 6 is a block diagram showing a general structure of a DRAM. Referring to the figure, the DRAM 50 comprises a memory cell array 51 for storing signals for transmitting memory information; a row & column address buffer 52 for receiving external address signals to select a memory cell constituting a unit storage circuit; a row decoder 53 and a column decoder 54 for designating the memory cell by decoding the address signals; a sense refresh amplifier 55 for amplifying and reading the signal stored in the designated memory cell; a data in buffer 56 and a data out buffer 57 for inputting/outputting data; and a clock generator 58 for generating clock signals.

FIG. 7 is an equivalent circuit diagram of a memory cell including a pair of bit lines in the memory cell array 51. Referring to FIG. 7, the memory cell comprises one transfer gate transistor 2 and one capacitor 10. The transfer gate transistor 2 has its gate connected to a word line 4, one of the source-drain regions connected to a bit line 26 and the other one of the source-drain regions connected to a capacitor 10.

Writing of data to the memory cell is carried out in the following manner. At first the word line 4 is activated and the transfer gate transistor 2 is turned on. Potential of high level or low level corresponding to the information to be written is applied to the bit line 26. Charges corresponding to the potential of the bit line 26 are stored in the capacitor 10. Then the word line 4 is inactivated, and transfer gate transistor 2 is turned off. Consequently, charges corresponding to the data are stored in the capacitor 10.

The reading operation is carried out in the following manner. The bit line 26 is held in an electrically isolated floating state in advance. When the word line 4 is activated, the transfer gate transistor 2 is turned on. The charges stored in the capacitor 10 are applied to the bit line 26. Consequently, potential change as small as several 100 mV appears on the bit line 26. The appeared potential change is amplified by the sense amplifier 55 to be the read signal.

In this manner, in reading, the charges representing information stored in the capacitor 10 are distributed again to the bit line 26, and the potential change at that time is detected. The capacity of the capacitor 10 is in proportion to the increase/decrease of the surface area of the electrode thereof. Consequently, if the capacitor size is reduced to increase degree of integration, the amount of signal charges stored is reduced. Accordingly, the potential change to be detected is also reduced, resulting in possible misreading. In addition, as the amount of signal charges is reduced, the memory cells become less immune to the soft errors. In view of the foregoing, improvement of capacitor structure has been done in order to ensure the amount of charges stored in the capacitor, that is, the capacity, even if the planar size of the capacitor is reduced as the degree of integration is increased.

One such example will be described. FIGS. 8A and 8B are a partial plan view of a memory cell array in the DRAM and a cross sectional view taken along the line VIII—VIII, respectively. The DRAM shown in this example is disclosed in, for example, "NOVEL STACKED CAPACITOR CELL FOR 64 Mb DRAM" ('89 Symposium on VLSI Technology Digest of Technical Papers, pp69-70, W. Wakamiya et al.).

FIGS. 8A and 8B show memory cells of 6 bits and 3 bits, respectively. Referring to FIGS. 8A and 8B, a field shield gate electrode 20 is formed in an element separating region of a surface of a p type silicon substrate 1, with a gate insulating film 21 formed therebetween. A plurality of memory cells are formed in an element forming region on the surface of the p type silicon substrate 1 surrounded by the field shield gate electrode 20. The memory cell comprises one transfer gate transistor 2 and one capacitor 10.

The transfer gate transistor 2 comprises a pair of $n^{30}$ impurity regions (source-drain) 5,5 formed on the surface of the p type silicon substrate 1, and a gate electrode (word line) 4 formed on the surface region of the p type silicon substrate 1 sandwiched by the pair of $n^+$ impurity regions 5,5, with a gate oxide film 3 formed therebetween. The periphery of the gate electrode 4 is covered by an insulating film 6.

The capacitor 10 comprises a lower electrode (storage node) 11, a dielectric layer 12 formed covering the surface of the lower electrode 11, and an upper electrode (cell plate) 13 formed thereon. The lower electrode 11 comprises a first portion 11a connected to one of the $n^{30}$ impurity regions 5 of the transfer gate transistor 2, and a cylindrical second portion 11b extending operate from the main surface of the substrate. The dielectric layer 12 is especially formed along the inner and outer surfaces of the second portion 11b of the lower electrode 11. Therefore, this portion contributes to increase the capacitor capacity. The capacitor having such structure is called a cylindrical capacitor.

A bit line 26 is connected through a contact hole 25 formed in the interlayer insulating layer 27 is connected to the other one of the $n^+$ impurity regions 5 of the transfer gate transistor 2, which is not connected to the capacitor 10. Word lines 4,4 are formed on the upper portion of the field shield gate electrode 20, with an insulating film 22 formed therebetween. A portion of the capacitor 10 extends to the upper portion of the word line 4 through the insulating film 6 and the nitride film 14.

As described the above, in a conventional DRAM, a cylindrical portion is formed in the capacitor to increase the capacity thereof. However, the height of the cylindrical capacitor is limited by the interconnection structure and by conditions for manufacturing. Further, as the degree of the integration is further improved, the planar area of occupation of the capacitor 10 becomes smaller, and accordingly, the diameter of the cylindrical portion of the capacitor 10 must be made smaller. A novel structure of a capacitor which can ensure prescribed capacitor capacity in higher degree of integration has been desired.

SUMMARY OF THE INVENTION

An object of the present invention is to increase capacity of a stacked capacitor in a DRAM.

Another object of the present invention is to increase capacity of a stacked capacitor, utilizing marginal space between adjacent memory cells in a DRAM.

The DRAM in accordance with the present invention has a storage region formed of a plurality of unit memory cells arranged on a main surface of a semiconductor memory device of a first conductivity type, each of first and second memory cells adjacent to each other including a switching element formed on the main surface of the semiconductor substrate and a signal holding passive element connected to the switching element for holding charges transferred from the switching element.

The switching element includes a pair of impurity regions of a second conductivity type formed in the semiconductor substrate, and a conductive layer formed on the main surface of the semiconductor substrate sandwiched by the pair of impurity regions, with an insulating film formed therebetween.

The signal holding passive element has a first electrode layer, which includes a first portion connected to one of the pair of impurity regions of the switching element, a portion thereof extending to an upper portion of the conductive layer of the switching element with an insulating layer formed therebetween, a wall like second portion extending from the surface of the first portion to the upper portion of the main surface of the semiconductor substrate, and a third portion continuous to the second portion, extending to the planar direction of the main surface of the semiconductor substrate. Further, it comprises a dielectric layer covering the outer surface of the first electrode layer, and a second electrode layer formed on the surface of the dielectric layer. The third portion of the first electrode layer of the signal holding passive element of the first memory cell is formed to be partially overlapping with the third portion of the first electrode layer of the signal holding passive element of the second memory cell.

The charge storage capacity of the signal holding passive element is in proportion to the opposing ares of the first and second electrodes, opposing to each other with the dielectric layer paused therebetween. Therefore, in the present invention, the outer surface of the third portion of the first electrode can be utilized as the charge storage region, which realizes increase of the charge storage capacity.

By forming the third portions of the first electrodes of the signal holding passive elements of adjacent memory cells overlapping with each other, the charge storage capacity of the signal holding passive elements can be increased, making use of the space between the adjacent memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
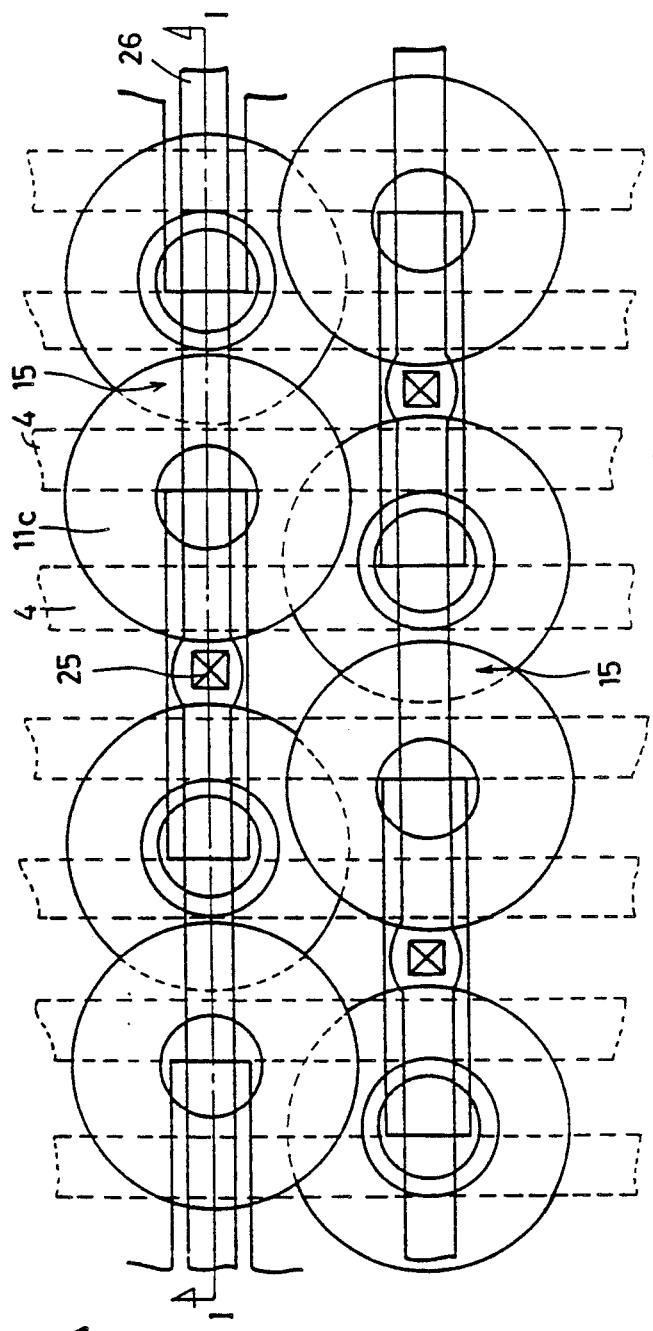
FIG. 1A shows a planar structure of a memory cell of a DRAM in accordance with a first embodiment of the present invention.
Figure 1B:
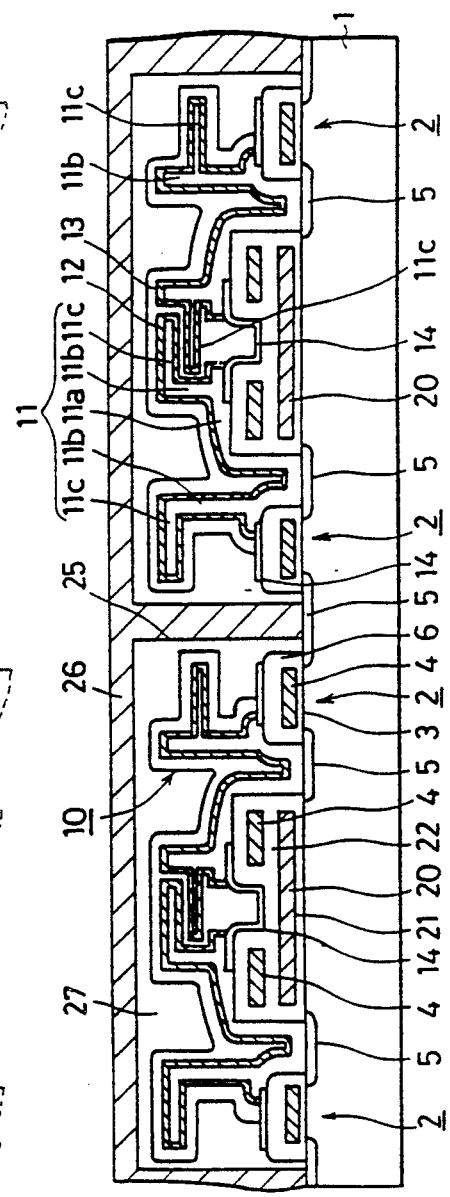
FIG. 1B is a cross sectional view taken a long the line I—I of FIG. 1A.

One embodiment of the present invention will be described with reference to the figures. FIG. 1B shows 4 bits of memory cells. Referring to FIGS. 1A and 1B, the memory cell comprises one transfer gate transistor 2 and one capacitor 10.

The transfer gate transistor 2 comprises a pair of n+ impurity regions 5,5, and a gate electrode (word line) 4 formed on the surface of a p type silicon substrate 1 positioned between the impurity regions with a gate oxide film 3 paused therebetween.

The structure of the capacitor 10, which is the characteristic of present invention, will be described in the following.

The lower electrode 11 of the capacitor 10 is formed of, for convenience of the description, three portions. The first portion is connected to one of the n+ impurity regions 5 of the transfer gate transistor 2, and one end thereof is laid on the upper portion of the gate electrode 4 with an insulating film 6 paused therebetween. The other end is extending on the upper portion of the word line 4 running on the upper portion of the field shield gate electrode 20, with the insulating film 6 paused therebetween.

The second portion is formed to have a cylindrical shape extending from the upper surface of the first portion to the upper portion of the main surface of the p type silicon substrate 1.

The third portion projects from the cylindrical outer surface of the second portion to the planar direction of the p type silicon substrate 1, like eaves. The planar shape of the eaves like third portion is disc, as is the cross sectional shape of the cylindrical second portion.

The dielectric layer 12 is formed along the surfaces of the first portion 11a to the third portion 11c of the lower electrode 11. The upper electrode 13 is formed to cover the surface of the dielectric layer 12.

In planar layout, the third portions 11c of the lower electrodes 11 of the adjacent capacitors are formed to have different heights, whereby in the vertical direction of the surface of the substrate, there are formed overlapping regions 15. By providing the overlapping regions 15, the eaves of the third portion 11c of the lower electrode 11 can be made longer, increasing the capacity of the capacitor.

Figures 2A, 2B:
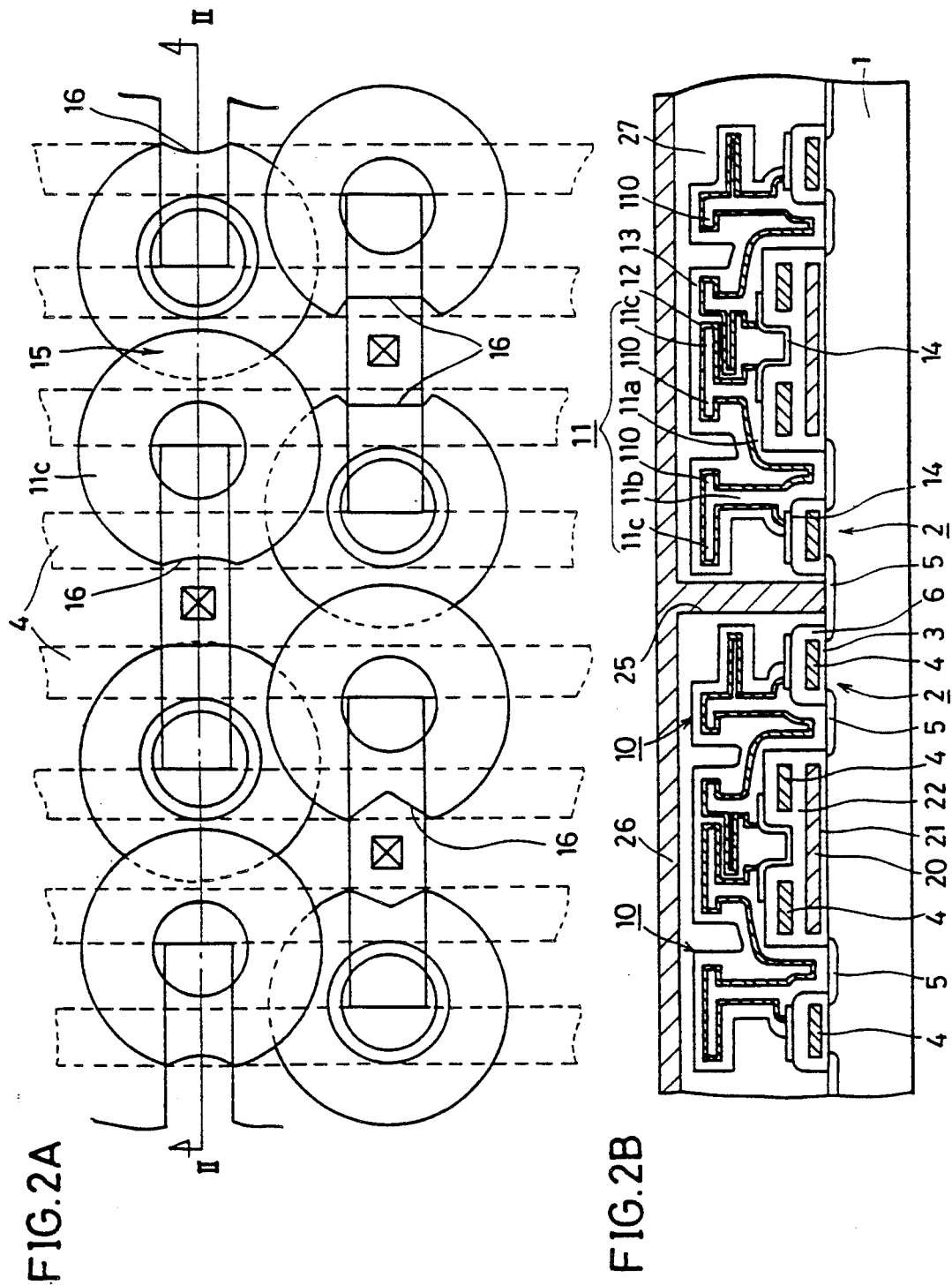
FIG. 2A shows a planar structure of a memory cell of a DRAM in accordance with a second embodiment of the present invention.
FIG. 2B is a cross sectional view taken a long the line II—II of FIG. 2A.

The structure of the DRAM memory cell in accordance with the second embodiment of the present invention will be described. Referring to FIG. 2A and 2B, the embodiment is a modification of the first embodiment, in which the third portion 11c of the lower electrode 11 has an eaves-like portion 110 extending to the inner side of the cylindrical second portion 11b. The capacity of the capacitor 10 is further increased by the eaves-like portion 110 of the third portion 11c. Further, in a portion near the contact hole 25 of the bit line 26, a notched portion 16 is provided in the third portion 11c of the lower electrode 11 of the capacitor. The provision of the notched portion 16 ensures electrical insulation between the bit line 26 and capacitor 10. The shape of the notched portion 16 may be triangle, trapezoid, or any other shape.

The structure of the DRAM memory cell in accordance with a third embodiment of the present invention will be described.

Figure 3A:
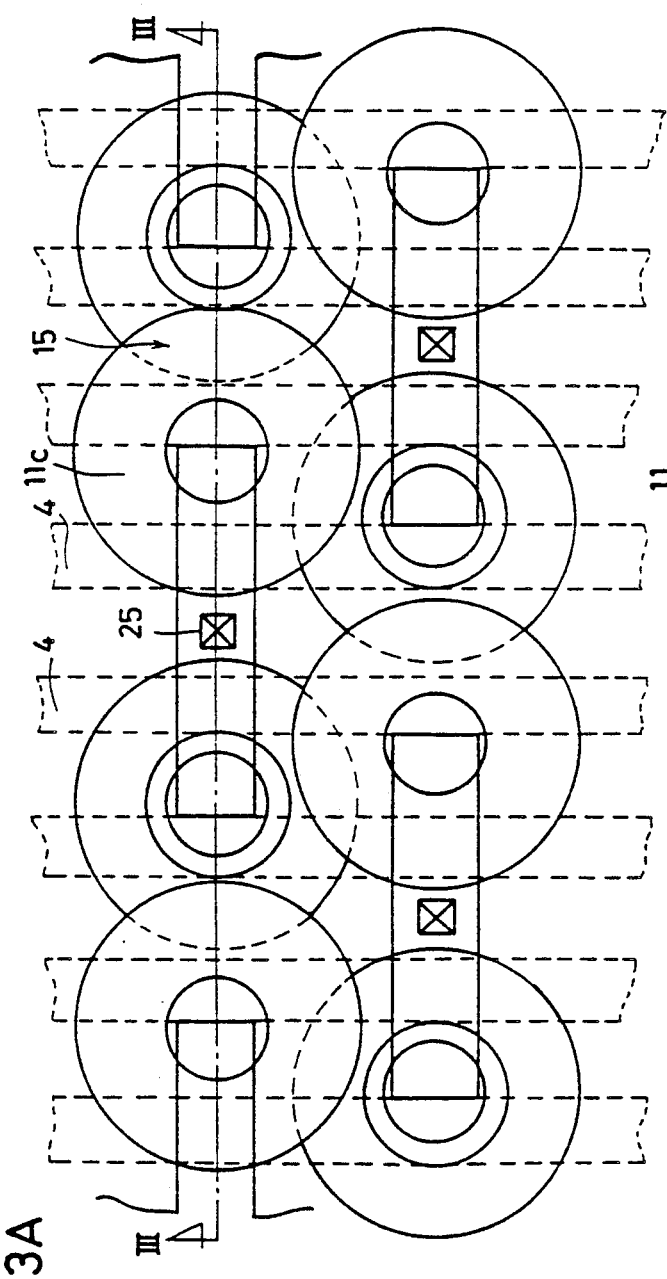
FIG. 3A shows a planar structure of a memory cell of a DRAM in accordance with a third embodiment of the present invention.
Figure 3B:
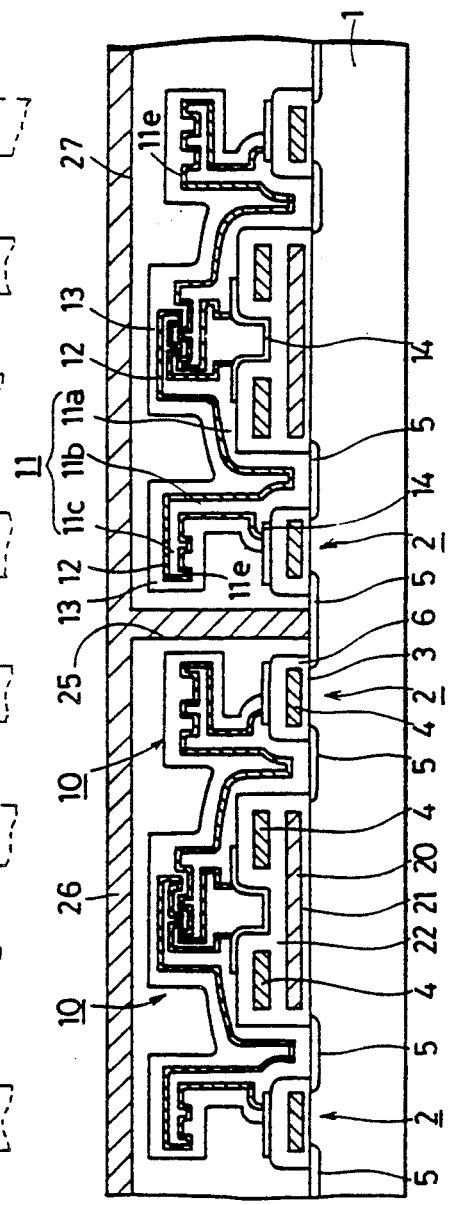
FIG. 3B is a cross sectional view taken a long the line III—III of FIG. 3A.

Referring to FIGS. 3A and 3B, the third embodiment is a modification of the capacitor in accordance with the first embodiment. More specifically, the third portion 11c of the lower electrode 11 of the capacitor 10 has projecting portions 11e on the upper surface or on the lower surface thereof. In the overlapping region 15 in which capacitors 10, 10 overlap with each other, the projecting portions 11e of the lower electrode 11 of one capacitor and the projecting portions 11e of the lower electrode 11 of the other capacitor are arranged to be engaged with each other.

Figure 4:
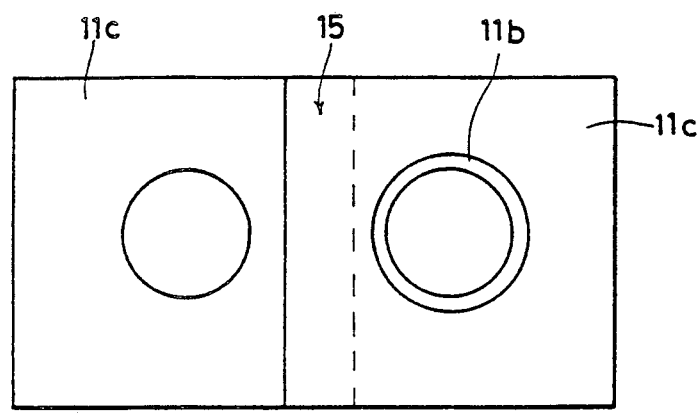
FIGS. 4 and 5 schematically show planar shapes of capacitors, showing modifications of the DRAM of the present invention.
Figure 5:
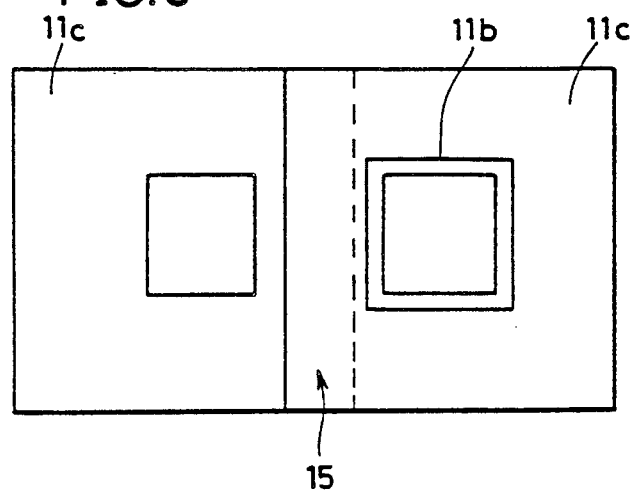
Figure 6:
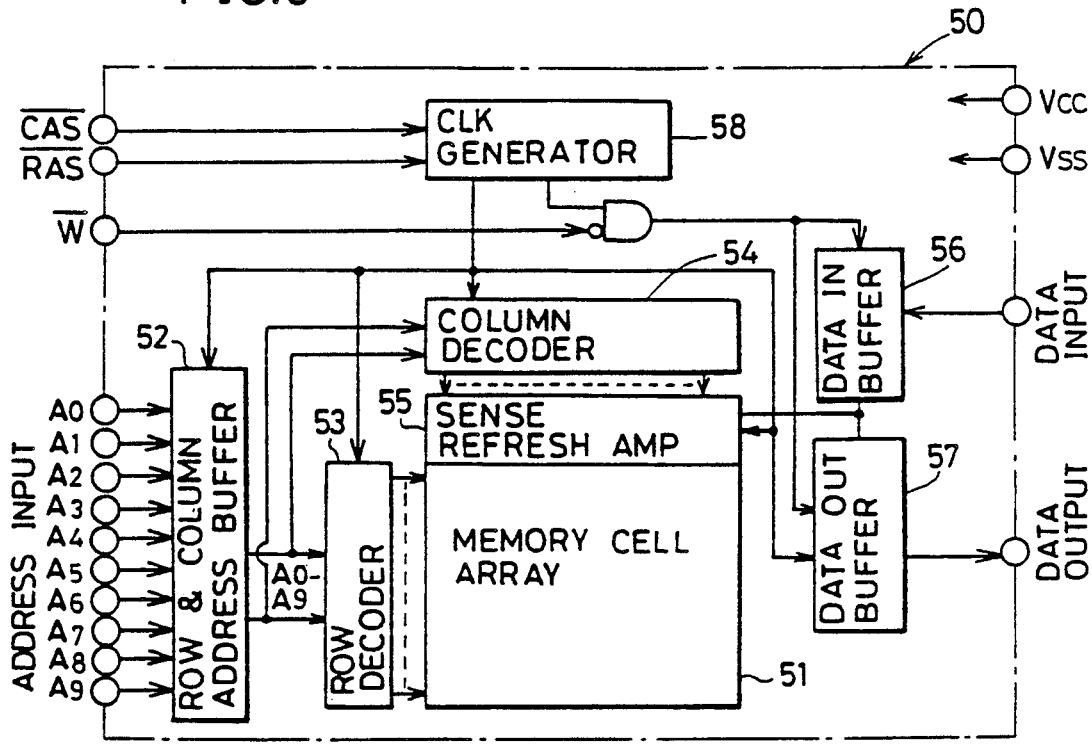
FIG. 6 is a block diagram showing a structure of a general DRAM.
Figure 7:
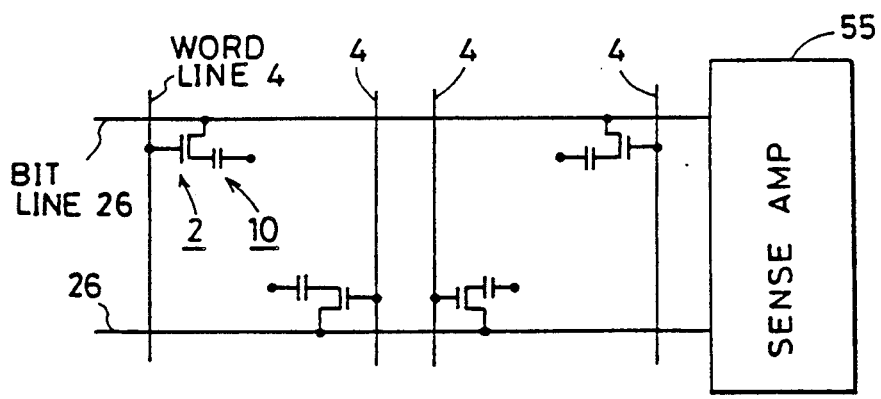
FIG. 7 is an equivalent circuit diagram of a memory cell including a pair of bit lines.
Figure 8A:
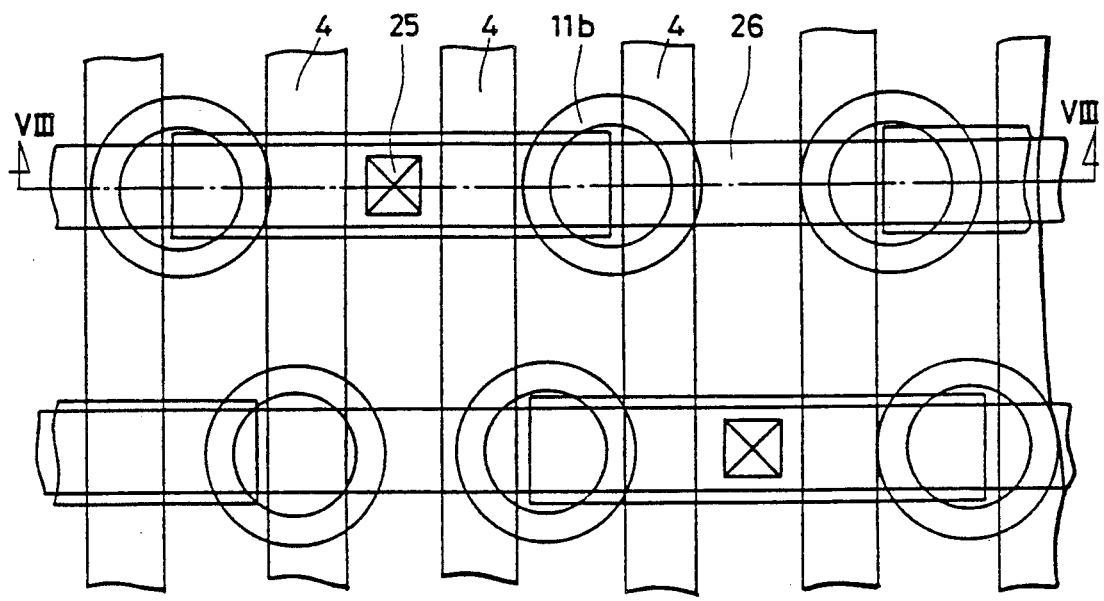
FIG. 8A is a plan view showing planar structure of a memory cell of a conventional DRAM.
Figure 8B:
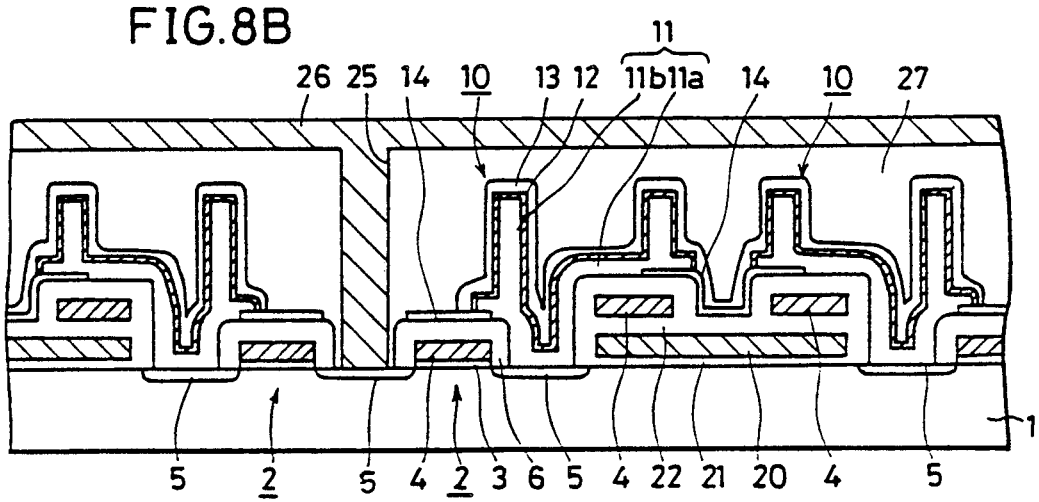
FIG. 8B is a cross sectional view taken along the line VIII—VIII of FIG. 8A.

Modifications of the present invention will be described with reference to FIGS. 4 and 5. In the present invention, the shape of the second portion 11b and third portion 11c of the lower electrode 11 of the capacitor may be arbitrarily formed. FIG. 4 schematically shows a combination of a cylindrical second portion 11b and a rectangular third portion 11c of the lower electrode 11 of the capacitor 10, as an example. FIG. 5 schematically shows a combination of a box shape second portion 11b and a rectangular third portion 11c. These are examples only, and any combination such as the second portion 11b having polygonal cross section or elliptical cross section with the third portion 11c having the polygonal or elliptical shape. The modifications on the shape of the lower electrode 11 may be implemented in the above described second and third embodiments.

Although the third portion 11c of the lower electrode 11 of the capacitor is a single layer in the above embodiments, two or more eaves-like portions may be formed, and the plurality of eaves-like third portions may be arranged to be overlapped with each other between adjacent capacitors.

As described above, in the DRAM of the present invention, electrode layers of signal holding passive elements are formed extending to be overlapped with each other, utilizing marginal space between adjacent memory cells. Therefore, the storage capacity of signal charges can be increased, whereby a highly reliable DRAM having prescribed storage capacity even in a high degree of integration can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM having a memory region formed of a plurality of unit memory cells arranged on a main surface of a semiconductor substrate of a first conductivity type, wherein each of adjacent first and second memory cells comprises a switching element formed on said main surface of said semiconductor substrate, and a signal holding passive element connected to said switching element for holding charges transferred from said switching element;

said switching element comprises a pair of impurity regions of a second conductivity type formed in said semiconductor substrate, and a conductive layer formed on said main surface of said semiconductor substrate sandwiched by said pair of impurity regions with an insulating film formed therebetween;

said signal holding passive element comprises a first electrode layer including a first portion connected to one of said pair of impurity regions of said switching element and extending to an upper portion of said conductive layer of said switching element with an insulating layer interposed therebetween, a wall shaped second portion extending from said first portion in an upward direction of said main surface of said semiconductor substrate, and a third portion, continuous to said wall shaped second portion, having an entire upper surface thereof planar and extending in a direction of said main surface of said semiconductor substrate, a dielectric layer formed to cover the outer surface of said first electrode layer, and a second electrode layer formed on the surface of said dielectric layer and having a planar portion covering upper portions of said upper surface of said third portion of said first electrode layer; wherein said third portion of said first electrode layer of said signal holding passive element of said first memory cell and said third portion of said first electrode layer of said signal holding passive element of said second memory cell are formed to be partially overlapped.

2. A DRAM according to claim 1, wherein
   said second portion of said first electrode layer is formed to have a cylindrical shape extending in an upward vertical direction of said main surface of said semiconductor substrate, and
   said third portion of said first electrode layer is formed to have a disc shape extending approximately in parallel to the main surface of said semiconductor substrate outward from a sideward surface of said second portion.

3. A DRAM according to claim 2, wherein
   said third portion of said first electrode layer extends from said side surface of said second portion in a direction toward said adjacent memory cell and in a direction from said adjacent memory cell.

4. A DRAM according to claim 2, wherein
   said third portion of said first electrode layer has concave and convex portions on a surface thereof.

5. A DRAM according to claim 2, wherein
   an interconnection layer extending on the upper portion of said signal holding passive element is connected through a contact portion to the impurity region which is opposing to the impurity region connected to said first electrode layer, of said switching element, and
   a notched portion is formed at a portion of said third portion of said first electrode layer near said contact portion of said interconnection layer.

6. A DRAM according to claim 1, wherein said second portion of said first electrode layer is formed to have a hollow prismatic shape extending from said first portion in an upward vertical direction of said main surface of said semiconductor substrate, and said third portion of said first electrode layer is formed to have a polygonal shape extending from said wall shaped second portion in a direction outward from said adjacent memory cell to be approximately parallel to the main surface of said semiconductor substrate.

7. A DRAM according to claim 1, wherein
said second portion of said first electrode layer is formed to have a cylindrical shape extending from said first portion in an upward vertical direction of said main surface of said semiconductor substrate, and said third portion of said first electrode layer is formed to have a polygonal shape extending from a surface of said walled shaped second portion in a direction outward from said adjacent memory cell approximately parallel to said main surface of said semiconductor substrate.

8. A DRAM having a memory region formed of a plurality of unit memory cells arranged on a main surface of a semiconductor substrate of a first conductivity type, wherein each of adjacent first and second memory cell comprises a switching element formed on said main surface of said semiconductor substrate, and a signal holding passive element connected to said switching element for holding charges transferred from said switching element;

said switching element comprises a pair of impurity regions of a second conductivity type formed in said semiconductor substrate, and a conductive layer formed on said main surface of said semiconductor substrate sandwiched by said pair of impurity regions with an insulating film formed therebetween;

said signal holding passive element comprises a first electrode layer including a first portion connected to one of said pair of impurity regions of said switching element and extending to an upper portion of said conductive layer of said switching element with an insulating layer interposed therebetween, a wall shaped second portion extending from said first portion in an upward direction of said main surface of said semiconductor substrate, and a third portion, continuous to said wall shaped second portion, extending in a planar direction of said main surface of said semiconductor substrate, a dielectric layer formed to cover the outer surface of said first electrode layer, and a second electrode layer formed on the surface of said dielectric layer; wherein said third portion of said first electrode layer of said signal holding passive element of said first memory cell and said third portion of said first electrode layer of said signal holding passive element of said second memory cell are formed to be partially overlapped, and said third portion of said first electrode layer has a substantially symmetrical shape extending from said wall shaped second portion.

9. A DRAM according to claim 8, wherein:
said second portion of said first electrode layer is formed to have a cylindrical shape extending in an upward vertical direction of said main surface of said semiconductor substrate, and said third portion of said first electrode layer is formed to have a disc shape extending approximately in parallel to the main surface of said semiconductor substrate outward from a sideward surface of said second portion.

10. A DRAM according to claim 9, wherein
said third portion of said first electrode layer extends from said side surface of said second portion in a direction toward said adjacent memory cell and in a direction from said adjacent memory cell.

11. A DRAM according to claim 9, wherein
said third portion of said first electrode layer has concave and convex portions on a surface thereof.

12. A DRAM according to claim 9, wherein
an interconnection layer extending on the upper portion of said signal holding passive element is connected through a contact portion to the impurity region which is opposing to the impurity region connected to said first electrode layer, of said switching element, and a notched portion is formed at a portion of said third portion of said first electrode layer near said contact portion of said interconnection layer.

13. A DRAM according to claim 8, wherein
said second portion of said first electrode layer is formed to have a hollow prismatic shape extending from said first portion in an upward vertical direction of said main surface of said semiconductor substrate, and said third portion of said first electrode layer is formed to have a polygonal shape extending from said wall shaped second portion in a direction outward from said adjacent memory cell to be approximately parallel to the main surface of said semiconductor substrate.

14. A DRAM according to claim 8, wherein
said second portion of said first electrode layer is formed to have a cylindrical shape extending from said first portion in an upward vertical direction of said main surface of said semiconductor substrate, and said third portion of said first electrode layer is formed to have a polygonal shape extending from a surface of said walled shaped second portion in a direction outward from said adjacent memory cell approximately parallel to said main surface of said semiconductor substrate.

15. A DRAM having a memory region formed of a plurality of unit memory cells arranged on a main surface of a semiconductor substrate of a first conductivity type including a pair of first and second adjacent interconnection layers, said first interconnection layer provided respectively for a first group of memory cells and said second interconnection layer provided respectively for a second group of memory cells, wherein each of adjacent first and second memory cells of said first and second group of memory cells comprise a switching element formed on said main surface of said semiconductor substrate, and a signal holding passive element connected to said switching element for holding charges transferred from said switching element;

said switching element comprises a pair of impurity regions of a second conductivity type formed in said semiconductor substrate, and a conductive layer formed on said main surface of said semiconductor substrate sandwiched by said pair of impurity regions with an insulating film formed therebetween;

said signal holding passive element comprises a first electrode layer including a first portion connected to one of said pair of impurity regions of said switching element and extending to an upper portion of said conductive layer of said switching element with an insulating layer interposed therebetween, a wall shaped second portion extending from said first portion in an upward direction of said main surface of said semiconductor substrate, and a third portion, continuous to said wall shaped second portion, extending in a planar direction of said main surface of said semiconductor substrate, a dielectric layer formed to cover the outer surface of said first electrode layer, and a second electrode layer formed on the surface of said dielectric layer; wherein said third portion of said first electrode layer of said signal holding passive element of said first memory cell and said third portion of said first electrode layer of said signal holding passive element of said second memory cell are formed to be partially overlapped, and said third portion of said first electrode layer of a signal holding passive element of said first group of memory cells and said third portion of said first electrode layer of a signal holding passive element of said second group of memory cells are formed to be partially overlapped.

16. A DRAM according to claim 15, wherein said second portion of said first electrode layer is formed to have a cylindrical shape extending in an upward vertical direction of said main surface of said semiconductor substrate, and said third portion of said first electrode layer is formed to have a disc shape extending approximately in parallel to the main surface of said semiconductor substrate outward from sideward surface of said second portion.

17. A DRAM according to claim 16, wherein said third portion of said first electrode layer extends from said side surface of said second portion in a direction toward said adjacent memory cell and in a direction from said adjacent memory cell.

18. A DRAM according to claim 16, wherein said third portion of said first electrode layer has concave and convex portions on a surface thereof.

19. A DRAM according to claim 16, wherein said first and second interconnection layer extending on the upper portion of respective said signal holding passive element of respective said first and second groups of memory cells and is connected through a contact portion to the impurity region which is opposing to the impurity region connected to said first electrode layer, of said switching element, and a notched portion is formed at a portion of said third portion of said first electrode layer near said contact portion of each said first and second interconnection layer.

20. A DRAM according to claim 5, wherein said second portion of said first electrode layer is formed to have a hollow prismatic shape extending from said first portion in an upward vertical direction of said main surface of said semiconductor substrate, and said third portion of said first electrode layer is formed to have a polygonal shape extending from said wall shaped second portion in a direction outward from said adjacent memory cell to be approximately parallel to the main surface of said semiconductor substrate.

21. A DRAM according to claim 15, wherein said second portion of said first electrode layer is formed to have a cylindrical shape extending from said first portion in an upward vertical direction of said main surface of said semiconductor substrate, and said third portion of said first electrode layer is formed to have a polygonal shape extending from a surface of said walled shaped second portion in a direction outward from said adjacent memory cell approximately parallel to said main surface of said semiconductor substrate.

* * * * *